United States Patent

Cornish et al.

(10) Patent No.: US 6,369,383 B1
(45) Date of Patent: Apr. 9, 2002

(54) FLEXBOARD REFLECTOR

(75) Inventors: Timothy J. Cornish, Catonsville; Harry K. Charles, Laurel; Paul D. Wienhold, Baltimore, all of MD (US)

(73) Assignee: The John Hopkins University, Baltimore, MD (US)

( * ) Notice: Subject to any disclaimer, the term of this patent is extended or adjusted under 35 U.S.C. 154(b) by 0 days.

(21) Appl. No.: 09/639,145

(22) Filed: Aug. 16, 2000

Related U.S. Application Data

(60) Provisional application No. 60/149,103, filed on Aug. 16, 1999.

(51) Int. Cl.[7] .......................... H01J 49/40; G01N 21/71
(52) U.S. Cl. ...................... 250/286; 250/287; 250/288; 436/153
(58) Field of Search ................................ 250/287, 286, 250/288; 436/153

(56) References Cited

U.S. PATENT DOCUMENTS

| | | | |
|---|---|---|---|
| 4,390,784 A | 6/1983 | Browning et al. | 250/287 |
| 4,583,183 A | 4/1986 | Winiecki et al. | 364/498 |
| 4,596,624 A * | 6/1986 | Frohlich et al. | 156/382 |
| 4,625,112 A | 11/1986 | Yoshida | 250/287 |
| 4,774,408 A | 9/1988 | Gohlke | 250/287 |
| 4,777,363 A | 10/1988 | Eiceman et al. | 250/286 |
| 5,053,343 A | 10/1991 | Vora et al. | 436/153 |
| 5,112,462 A | 5/1992 | Swisher | 205/165 |
| 5,280,175 A | 1/1994 | Karl | 250/287 |
| 5,464,985 A | 11/1995 | Cornish et al. | 250/396 |
| 5,814,813 A | 9/1998 | Cotter et al. | 250/287 |
| 5,818,049 A | 10/1998 | Bailey et al. | 250/343 |
| 5,834,771 A | 11/1998 | Yoon et al. | 250/286 |
| 5,869,832 A | 2/1999 | Wang et al. | 250/288 |
| 5,994,695 A | 11/1999 | Young | 250/287 |

* cited by examiner

*Primary Examiner*—Jack Berman
*Assistant Examiner*—K. Fernandez
(74) *Attorney, Agent, or Firm*—Ernest R. Graf; Carla M. Krivak

(57) ABSTRACT

A novel technique utilizing the precision of printed circuit board design and the physical versatility of thin, flexible substrates is disclosed to produce a new type of ion reflector. A precisely defined series of thin conductive strips (traces) are etched onto a flat, flexible circuit board substrate. Preferably, the thin conductive strips are further apart at one end of the substrate and get increasingly closer towards the other end of the substrate. The flexible substrate is then rolled into a tube to form the reflector body, with the conductive strips forming the rings of the ion reflector. The spacing between the traces, and hence the ring spacing, can be readily varied by adjusting the conductor pattern on the substrate sheet during the etching process. By adjusting the spacing between the rings, the characteristics of the field created by the reflectron can be easily customized to the needs of the user.

11 Claims, 6 Drawing Sheets

FLEXBOARD REFLECTOR

This application is based on provisional Application No. 60/149,103, filed Aug. 16, 1999, which is incorporated fully herein by reference.

BACKGROUND OF THE INVENTION

1. Field of the Invention

The present invention relates to a Time-of-Flight (TOF) mass spectrometer and, more particularly, to a novel ion reflectron useable in, for example, a TOF mass spectrometer and a method of manufacturing same.

2. Description of the Related Art

A spectrometer is an analytical instrument in which an emission (e.g., particles or radiation) is dispersed according to some property (e.g., mass or energy) of the emission and the amount of dispersion is measured. Analysis of the dispersion measurement can reveal information regarding the emission, such as the identity of the individual particles of the emission.

It is well known that energy applied to ionized particles (ions) via an electric field will cause the ions to move. This principle is used in different kinds of spectrometers to accomplish different goals. For example, an ion mobility spectrometer (IMS) is used to detect and analyze organic vapors or contaminants in the atmosphere. As described and shown in U.S. Pat. No. 5,834,771 to Yoon et al., a typical IMS detector cell (also called an ion drift tube) comprises a reaction region for generating ions, a drift region or drift tube for separating ions, and a collector.

A carrier or drift gas along with a sample gas introduced into the IMS are ionized and then the sample is moved through the drift tube by an electric field applied along the drift tube. Different ions in the sample are separated based on their behavior in the drift tube as they collide with the drift gas. Each type of ion exhibits its own identifiable behavior pattern based on its particular structure, e.g., each ion shows unique velocity due to its mass, size, and charge. The separated ions proceed further down the drift tube and collide with the collector, producing a measurable current. The drift velocities and the peak currents of the ions arriving at the collector provide a basis for the approximating the identity of the samples introduced into the reaction region; however, it is not an exacting technique, since two different ion types having similar masses and similar interaction with the drift gas will be difficult, if not impossible, to distinguish from each other.

A variety of methods of generating the electrical field used in the reaction region and the drift tube are available, as described in the previously-mentioned '771 patent. The subject matter of the '771 patent is directed to one such method involving the fixation of a flexible printed circuit board onto the surface of the drift tube. Evenly-spaced parallel conductive bands are patterned on the flexible circuit board and the electrically conductive bands are connected to adjacent bands via resistances. Through proper biasing of the resistors, the conductive bands are placed at potentials relative to their positions along the tube, so that a uniform electric field is developed along the axis of the tube.

Mass spectrometry is another well-known spectrometry method. Mass spectrometers are used to determine, with precision, the chemical composition of substances and the structures of molecules. One type of mass spectrometer, a time-of-flight (TOF) mass spectrometer, is an instrument that records the mass spectra of compounds or mixtures of compounds by measuring the times (usually of the order of tens to hundreds of microseconds) for molecular and/or fragment ions of those compounds to traverse a (generally) field-free drift region within a high vacuum environment. TOF mass spectrometers operate based on the principle that, when ions are accelerated with a fixed energy, the velocity of the ions differ dependant exclusively on mass and charge. Thus, the time-of-flight from point A to point B will likewise differ dependant on the mass of the ion. Using a TOF mass spectrometer, the mass of an ion can be calculated based upon its time of flight. There are no collisions with a carrier gas as occurs in an IMS—only the velocity, and therefore the mass and charge (usually +1), is utilized for the calculation. This allows the molecule to be identified with precision.

TOF mass spectrometers are comprised of a source region, where neutral molecules are ionized, a drift region, followed by an ion reflector (also known as a reflectron) and a detector. In the ion source, ions are formed in a high vacuum environment followed by acceleration down a field free drift region. The ions separate in time dependent only on their mass/charge ratio (normally the charge is +1). Upon entering the opposing field created by the ion reflector, ions gradually slow down, stop, and reverse direction. The detection occurs after the ions are re-accelerated out of the ion reflector. In addition to enabling the calculation of the mass of the ions, ion packet peak widths are sharpened by their passage through the ion reflector, resulting in an enhancement of the instrument's resolving power.

Reflectrons have been in use since the late 1960's and are typically constructed by configuring plural individually manufactured metallic rings along ceramic rods using insulating spacers to separate each ring from the next. This technique is labor intensive, costly, and limits the flexibility of design due to the manufacture and handling of extremely thin rings (a few mils in thickness) of relatively large diameter (1" or greater). An example of such a configuration is shown in U.S. Pat. No. 4,625,112 to Yoshida. While many permutations of this device exist, the method of construction has been limited to the ring method described above.

Similar to the parallel conductive traces of the '771 patent, the rings are placed at potentials that develop electric fields along the axis of the cylinder. However, in contrast to the IMS method, which develops a uniform electric field along the drift tube and which can only approximate the identity of molecules in a sample, a TOF mass spectrometer is capable of measuring atomic and molecular weights with high precision. Furthermore, to improve performance in a TOF mass spectrometer, reflectrons have been constructed which develop non-uniform fields along the reflectron tube. The non-uniform fields are generated by utilizing a voltage divider network which varies the potential applied to each of the evenly-spaced rings. A detailed explanation of non-linear reflectron theory can be found in U.S. Pat. No. 5,464,985 to Cornish et al., incorporated fully herein by reference.

While the above-described TOF mass spectrometer design has proved quite satisfactory for large reflectors in which the rings are relatively large in diameter and equally spaced, new applications utilizing remote TOF mass spectrometers may require miniaturized components, rugged construction, and/or the use of lightweight materials. Smaller TOF mass spectrometers have reduced drift length, necessitating the use of ideal energy focusing devices (reflectrons) to maximize resolution.

Therefore, it would be desirable to develop new methods of construction to fabricate miniature ion reflectors for TOF's which are smaller, rugged, and lightweight and which provide maximum resolution.

SUMMARY OF THE INVENTION

To this end, a novel technique utilizing the precision of printed circuit board design and the physical versatility of thin, flexible substrates has been devised to produce a new type of ion reflector. In this method, a precisely defined series of thin conductive strips (traces) are etched onto a flat, flexible circuit board substrate. The flexible substrate is then rolled into a tube to form the reflector body, with the conductive strips forming the rings of the ion reflector. The spacing between the traces, and hence the ring spacing, can be readily varied by adjusting the conductor pattern on the substrate sheet during the etching process.

The present invention is a multi-layered reflectron for a time-of-flight (TOF) mass spectrometer, comprising: plural structural layers; and at least one flexible electrode layer, the flexible electrode layer creating an electric field in the reflectron when a voltage is applied thereto to slow down, stop, and reverse the direction of travel of ions traveling through said reflectron. The flexible electrode layer comprises a flexible substrate having a plurality of conducting traces formed thereon, the flexible substrate being rolled into a tubular shape so that said conducting traces form rings surrounding a central axis through the length of the reflectron. The distance between the conducting traces, and therefore the rings, can, if desired, gradually decrease from one end of the reflectron to the other. The distance between the conducting traces can also be equally spaced, or user defined (any spacing desired).

The method of manufacturing a reflectron according to one representation of the present invention can comprise the steps of: photo-etching a plurality of conducting traces onto a flexible substrate sheet; wrapping the photo-etched substrate sheet around a mandrel so that the plural conducting traces coincide to form a plurality of rings surrounding the mandrel, leaving a connector end of the flexible substrate sheet unwrapped; wrapping one or more plies or layers of uncured, pre-impregnated composite material around the substrate, so that all of the exposed portion of the substrate, except for the unwrapped connector end, is covered by the composite material ply(s); curing the photo-etched substrate and composite material on the mandrel; and removing the cured photo-etched substrate and composite material from the mandrel to form a rigid tubular reflectron.

These objects, together with other objects and advantages which will be subsequently apparent, reside in the details of construction and operation as more fully described and claimed hereinafter, reference being had to the accompanying drawings forming a part hereof, wherein like reference numerals refer to like parts throughout.

DESCRIPTION OF THE PREFERRED EMBODIMENTS

Figure 1:
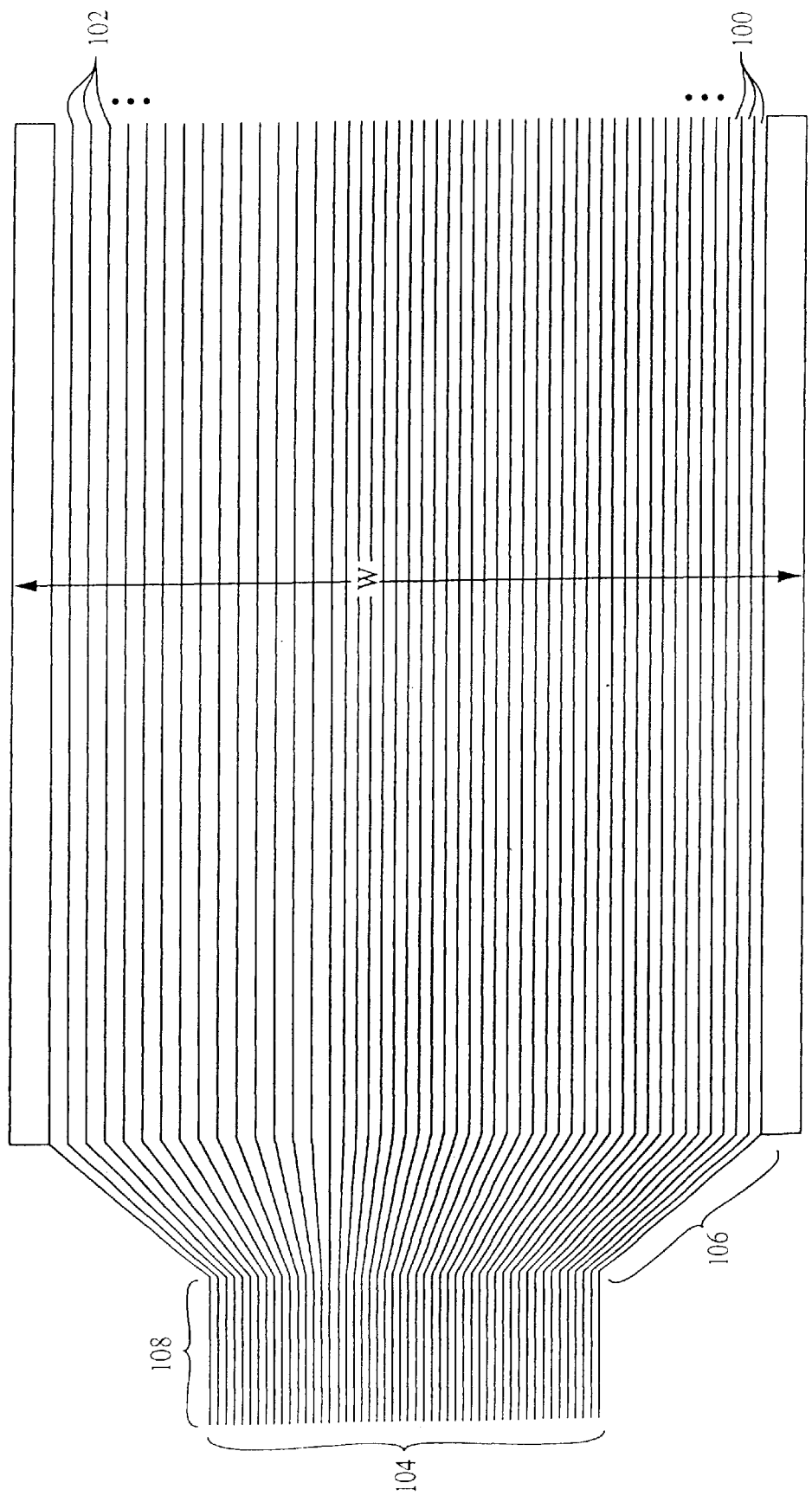
FIG. 1 illustrates a flexible circuit board substrate prepared according to a first fabrication step of the present invention.

FIG. 1 illustrates a circuit board substrate 100 prepared according to a first step of the present invention. In accordance with the present invention, parallel conductive traces 102 (50 traces are illustrated in FIG. 1 for purpose of example) are etched into the flexible circuit board substrate material using conventional etching methods. In the example shown in FIG. 1, a connector end 104 of the conducting traces 102 is etched such that the conducting traces 102 are angled at a tapered section 106. This allows the conducting traces 102 to converge at connector end 104 so that at a connector section 108, they are closer together and properly aligned, thereby allowing for easy attachment of a connector (not shown).

In one representation of the present invention, the circuit board substrate 100 comprises copper clad Kapton (manufactured by Dupont) polyimide film approximately 0.002" thick, and the conductive traces 102 etched onto the circuit board substrate 102 are approximately 0.008" wide by 0.001" thick. The distance between each conductive trace can be uniform or, as shown in FIG. 1, can be narrower between some traces and wider between others. The distance between the rings in a reflectron tube affects the field generated by the tube, and thus the distance between the traces or the width of the traces can be adjusted according to the needs of the end-user. Further, as discussed in more detail below, traces A and B on either end (see FIG. 1) may be wider than the other traces to facilitate electrical connections to the outermost rings when fabrication of the reflectron is completed.

Once the flexible circuit board substrate 100 has been etched as described above it is rolled into the shape of a tube and supported in this tubular shape in a rigid fashion. While supporting the tube in a rigid fashion is not required, doing so will assure symmetry of the rings formed by the rolling of the flexible circuit board substrate 100, which results in precision with respect to the field generated by the rings.

Figure 2:
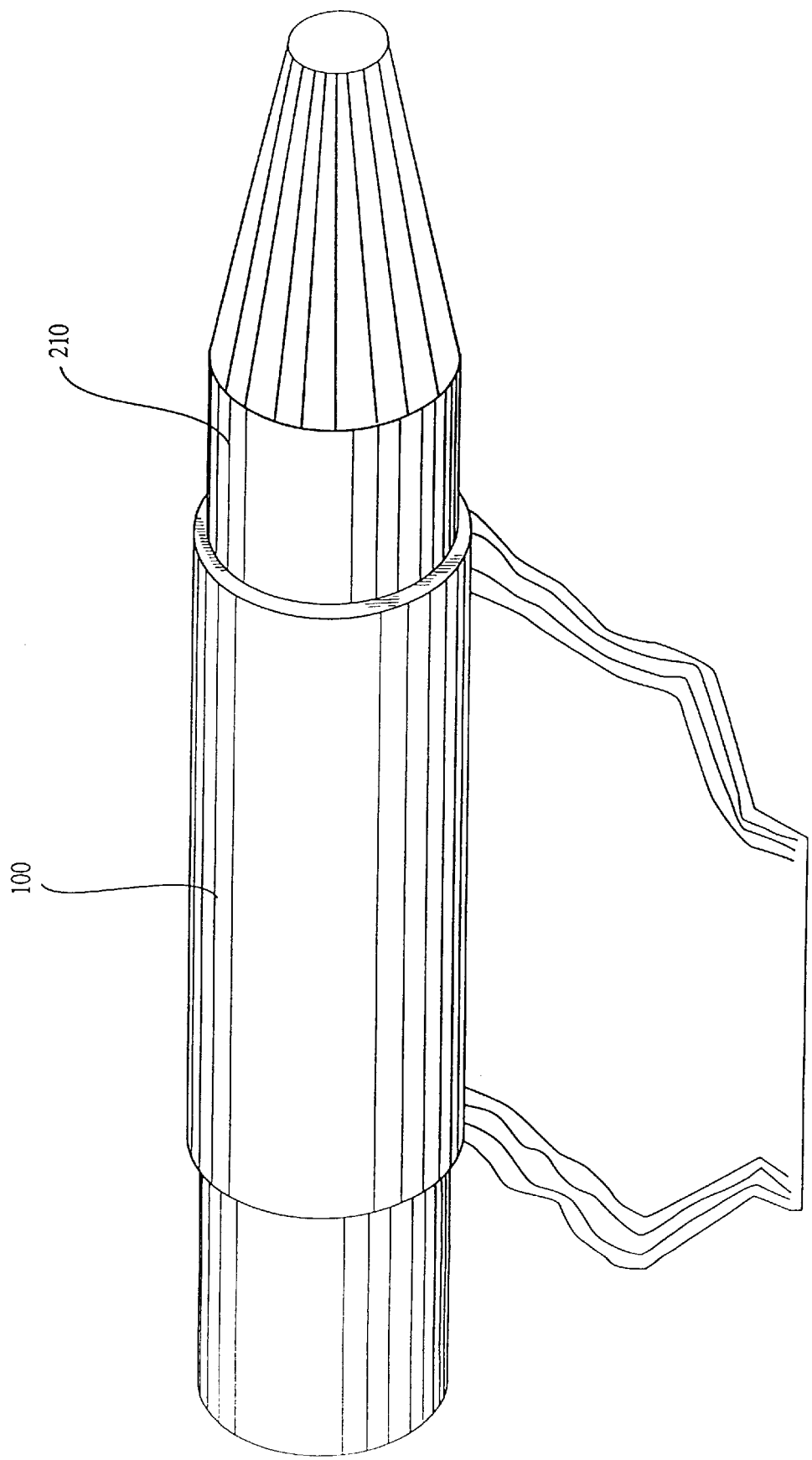
FIG. 2 illustrates a second fabrication step in accordance with the present invention
Figure 3:
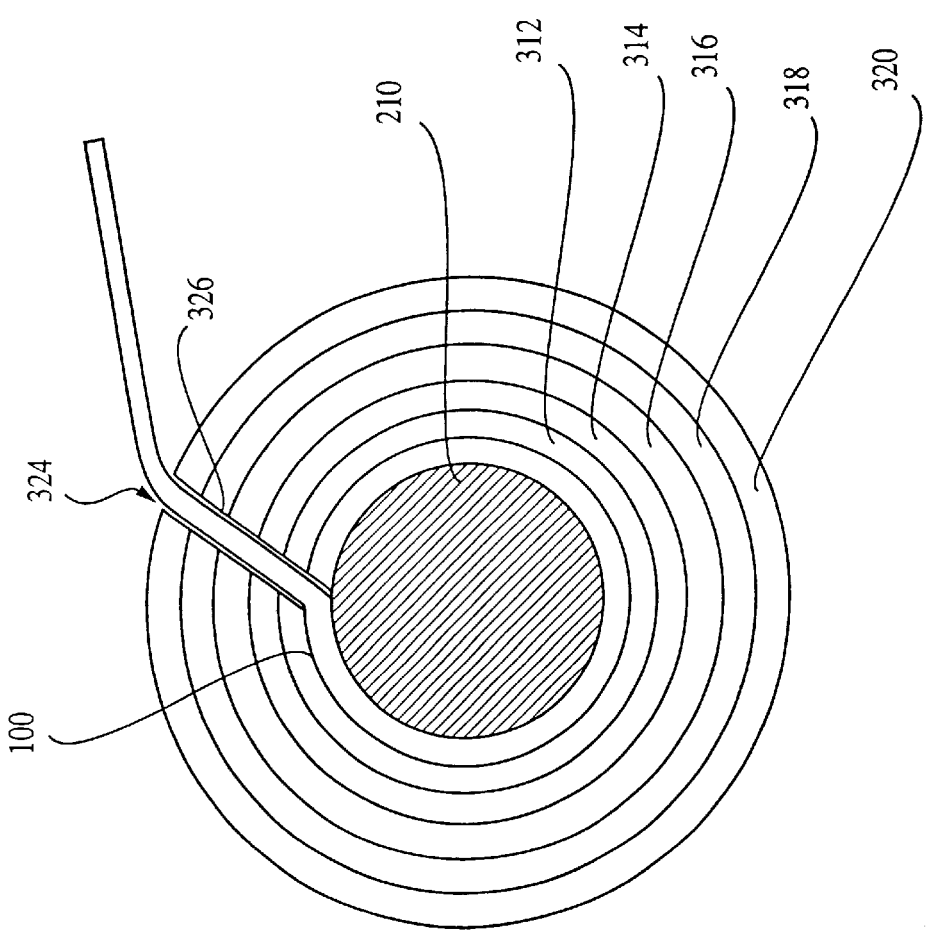
FIG. 3 illustrates a third fabrication step in accordance with the present invention.

Referring now to FIGS. 2 and 3, given as examples. In FIG. 2, the flexible circuit board substrate 100 is rolled around a mandrel 210 to form the tubular shape. When the flexible circuit board substrate 100 is rolled around mandrel 210, each trace aligns with itself to form the rings required to create the fields. Due to the thinness of the flexible circuit board 100, there is no need to electrically connect the ends of each trace; they are at the same potential assuring a continuous field inside the tube.

Next, layers of uncured, pre-impregnated fiberglass are wrapped around the flexible circuit board substrate 100 which is wrapped around the mandrel 210 (FIG. 3). In FIG. 3, five fiberglass plies 312, 314, 316, 318, and 320, each approximately 0.010" thick, are used. The dimensions of the fiberglass plies should be such that their width equals or exceeds the distance "W" of FIG. 1, and their length is approximately equal to the circumference of the mandrel 210.

By using fiberglass plies having this length, when the plies are wrapped around the rolled flexible circuit board substrate 100, a slight opening 324 exists through which the connector end 104 of the flexible circuit board substrate 100 can extend. To allow the flexible circuit board substrate 100 to follow its natural shape and thus minimize creasing, in the second embodiment the starting position of each successive fiberglass ply is moved slightly with respect to the previous ply so that a gradual "ramp" 326 is formed, thereby creating a gradual angling of the flexible substrate 100 away from the mandrel 210 as shown.

Figure 4:
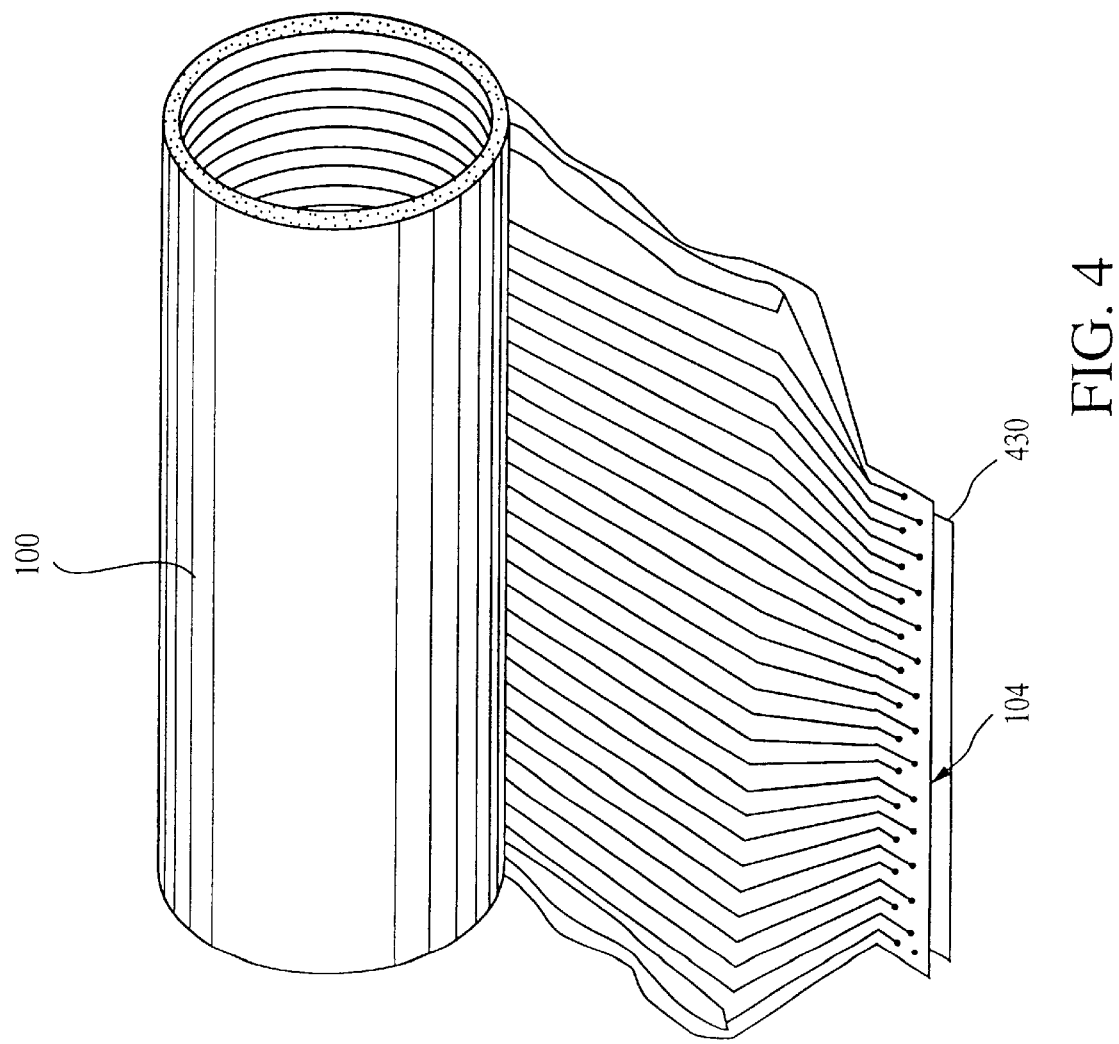
FIG. 4 illustrates a reflector assembly fabricated in accordance with the steps illustrated in FIGS. 1–3.

Once the reflector assembly is formed as described above, the assembly is cured under heat and pressure in a known manner for approximately two hours. Then the assembly is allowed to cool and the mandrel 210 is removed. It should be noted that other materials can be used that do not require curing with heat and pressure. Therefore, the type of material used in the assembly dictates the type of curing. The final wall thickness of the rolled reflector assembly constructed in this manner is approximately 0.060". A reflector assembly fabricated according to the previously described steps is shown in FIG. 4. A standard connector 430, such as a standard 50 pin ribbon connector may be coupled to the connector end 104 so that the reflectron can be easily incorporated into a mass spectrometer or any other device requiring a reflectron. If desired, end caps, (e.g., polycarbonate plugs, not shown, or other suitable material) can be installed on either end of the reflectron to both support the reflectron in the vacuum chamber of the mass spectrometer and to provide a surface on which to affix grids. As is well known, the grids define and shape the field of the mass spectrometer and are usually made of stainless or nickel and/or etched wire electrically connected to traces A and B. The larger width of traces A and B maximizes the integrity of the electrical connection between the grid/caps and the traces. The cylindrical shape of the support tube and integral ring structure allows the grid/caps to be fabricated in many different configurations, e.g., as disk inserts or overlapping caps. If desired, relief grooves can be machined in the cylinder to ensure appropriate positioning of such a cap or grid.

Reflectors produced according to the present invention are very lightweight, extremely rugged, and inexpensively and easily mass produced. Additional advantages over the prior art include: greater design flexibility in selecting ring width and spaces; no need to hand-assemble the rings as is required by the prior art; the spacing and width of and distance between the rings can be easily controlled by reproducible photo lithographic processing or other appropriate processing depending on the material used; lithographic patterns or other patterns produced are scalable for various applications using simple computer-aided design techniques; reflectron replacement can be easily accomplished because of the plug-in nature of the reflectron; and use of high Tg circuit board material allows operation of the reflectron over wide temperature ranges.

While the present invention is described herein in connection with a TOF mass spectrometer, a reflectron fabricated in accordance with the present invention can be used in connection with any device requiring the creation of electrostatic fields, and particularly in devices requiring precision, rugged, lightweight, inexpensive, modular, and/or mass producible construction. Further, while a cylindrical reflectron is described herein and shown in the drawings, with simple modifications to the circuit mask, other geometrical shapes, such as conical reflectors, can also be fabricated with high precision.

While the above-described process uses cured fiberglass layers to provide the rigid tubular support required for use as an ion reflector, any cured composite material that can be wrapped or rolled around the rolled flexible circuit board will suffice. Further, the etched flexible circuit board can be formed as a rigid tube using any method which results in a rigid tube having the rings formed along the interior of the tube. For example, instead of using the fiberglass layers as described above, the etched flexible circuit board could be glued (laminated) to the inside of an appropriate diameter support tube. The support tube could be made of metal or composite materials, depending upon the required operating conditions. To enable the connector end of the flexible circuit board to extend outside of the tube, the tube could be provided with a slot that runs almost the entire length of the tube. This slot serves the same purpose as the opening 324 of FIG. 3, i.e., it allows one end of the flexible circuit board to extend through the tube to permit easy wire attachment or connector attachment to the individual rings formed on the inside of the tube.

Figure 5:
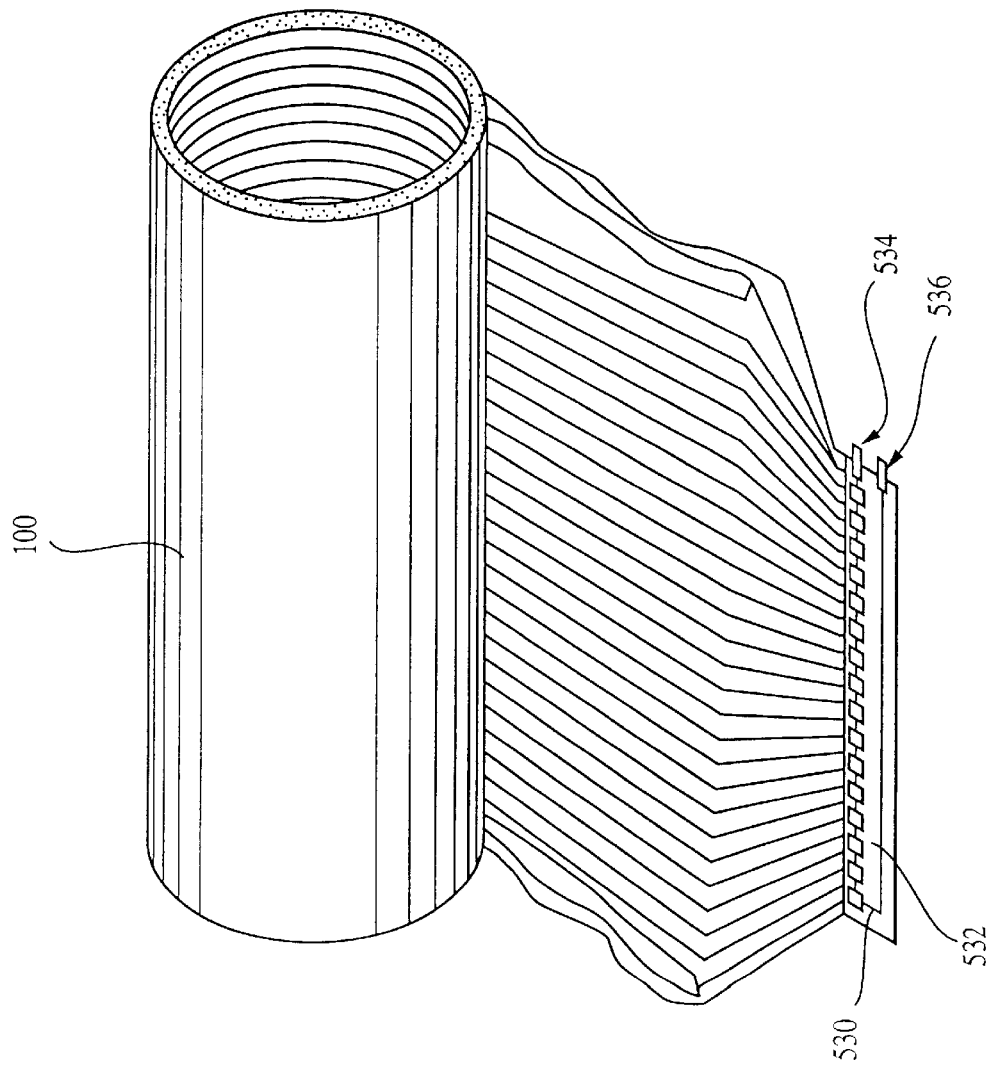
FIG. 5 illustrates that a connector end of the flexible circuit board of the present invention can be terminated at a rigid circuit portion.

FIG. 5 shows that, if desired, the connector end 104 of flexible circuit board 100 can be terminated at a rigid circuit board portion 530 as shown. Rigid circuit board portion 530 can accommodates, for example, a voltage divider network 532 (i.e., the precision resistors and the interconnection pattern necessary to apply a specified voltage to each of the rings). The incorporation of the voltage divider network 532 onto the same structure as the ring assembly allows the entire reflectron to be easily replaced by simply disconnecting the assembly from the two leads 534 and 536 connecting the voltage divider network to the high voltage power supply. Configured in this manner, a simple two-pin connector is all that is required (to make the high voltage power supply connection).

Figure 6:
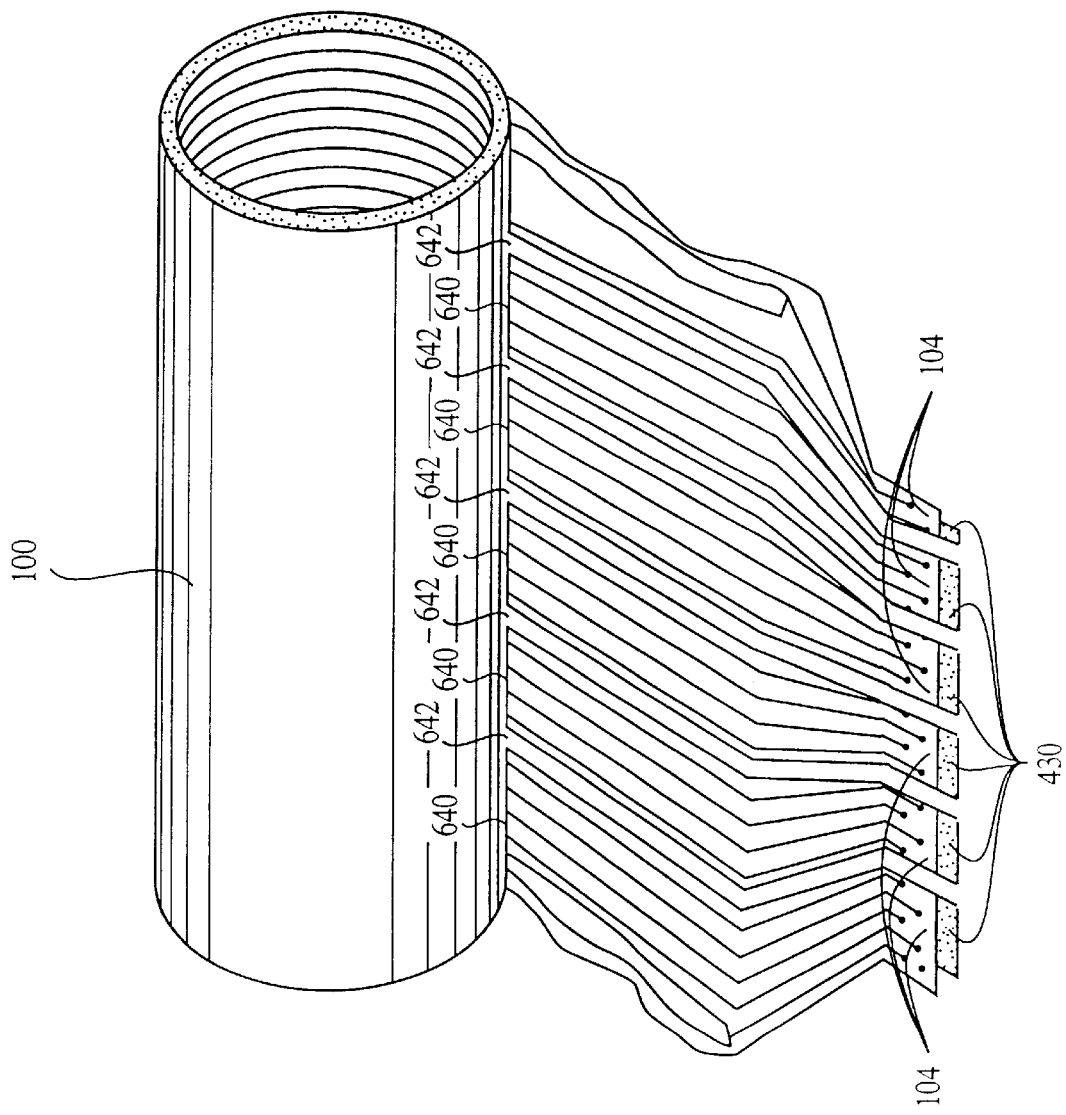
FIG. 6 illustrates that the flexible circuit board of the present invention can be split into multiple segments.

If it is necessary to reduce the weight of the reflectron tube even further, as illustrated in FIG. 6, the circuit board 100 may be split into multiple segments as it exits the reflectron tube and is passed through multiple slots 640; the multiple slots 640 create intervening slot supports 642, which provide additional rigidity to the structure while still allowing access to make electrical connections to the conductive traces 102.

The foregoing is considered as illustrative only of the principles of the invention. Further, since numerous modifications and changes will readily occur to those skilled in the art, it is not desired to limit the invention to the exact construction and applications shown and described. Accordingly, all suitable modifications and equivalents may be resorted to, falling within the scope of the invention and the appended claims and their equivalents.

What is claimed is:

1. A reflectron comprising:
    a rigid support having an axial configuration that forms an interior region for receiving ions, said rigid support having an interior surface and an exterior surface, said rigid support defining a longitudinal slot between its interior and exterior surfaces; and
    a flexible circuit board having a rolled portion and a free connector end, said rolled portion attached to said interior surface of said rigid support and said free connector end extending through said longitudinal slot in said rigid support, said flexible circuit board having conducting traces thereon, whereby current flowing through said traces induces an electromagnetic field for axially accelerating ions in said interior region.

2. A reflectron according to claim 1 wherein said rigid support comprises plural structural layers.

3. A reflectron according to claim 2, wherein said plural structural layers comprise cured composite materials.

4. A reflectron according to claim 1, wherein said rigid support forms a cylindrical tube.

5. A reflectron according to claim 1, wherein said rigid support forms a rectangular channel.

6. A reflectron according to claim 4, wherein said traces form circular rings.

7. A reflectron according to claim 1, wherein said conducting traces are separated by varying distances.

8. A reflectron according to claim 1, wherein the distance between said conducting traces is user defined.

9. A reflectron according to claim 1, further comprising a standard ribbon connector attached to said free connector end of said flexible circuit board.

10. A reflectron according to claim 1, wherein said longitudinal slot in said rigid support defines a gradual ramp, allowing said flexible circuit board to follow its natural shape and minimize creasing.

11. A reflectron comprising, means for providing rigid structural support having interior and exterior surfaces and a longitudinal axis, said means for providing rigid structural support defining a longitudinal slot between said interior and exterior surfaces; and means for providing flexible circuits having first and second ends, said first end attached to said interior surface of said means for providing rigid structural support, said second end protruding through said longitudinal slot, whereby a current flowing in said means for providing flexible circuits induces an electromagnetic field along said longitudinal axis.

* * * * *